United States Patent
Lindholm

(10) Patent No.: US 7,843,189 B2
(45) Date of Patent: Nov. 30, 2010

(54) CURRENT SENSOR HAVING COIL MOUNTED TO CURRENT CARRYING BUS AND RELATED SYSTEM

(75) Inventor: Brian Eric Lindholm, Salem, VA (US)

(73) Assignee: General Electric Company, Schenectady, NY (US)

( * ) Notice: Subject to any disclaimer, the term of this patent is extended or adjusted under 35 U.S.C. 154(b) by 134 days.

(21) Appl. No.: 12/338,200

(22) Filed: Dec. 18, 2008

(65) Prior Publication Data
US 2010/0156393 A1    Jun. 24, 2010

(51) Int. Cl.
*G01R 15/18* (2006.01)
(52) U.S. Cl. .................... 324/126; 324/127
(58) Field of Classification Search ............... None
See application file for complete search history.

(56) References Cited

U.S. PATENT DOCUMENTS

| | | | |
|---|---|---|---|
| 4,829,298 A | * | 5/1989 | Fernandes ............ 340/870.27 |
| 6,300,701 B1 | * | 10/2001 | Ong et al. ............ 310/179 |
| 7,078,888 B2 | | 7/2006 | Budillon et al. |

FOREIGN PATENT DOCUMENTS

| | | |
|---|---|---|
| DE | 2845155 A1 | 4/1980 |
| FR | 2507811 A1 | 12/1982 |
| JP | 11083906 A | 3/1999 |

OTHER PUBLICATIONS

European Patent Application No. 09177816.7, Search Report dated Apr. 9, 2010.

* cited by examiner

*Primary Examiner*—Vinh P Nguyen
(74) *Attorney, Agent, or Firm*—Hoffman Warnick LLC; Ernest G. Cusick

(57) ABSTRACT

A current sensor includes a coil for sensing current in a current carrying bus, and a mount for mounting the coil to the current carrying bus at a distance from the bus. A system including the current sensor includes similar structure.

17 Claims, 6 Drawing Sheets

CURRENT SENSOR HAVING COIL MOUNTED TO CURRENT CARRYING BUS AND RELATED SYSTEM

BACKGROUND OF THE INVENTION

The invention relates generally to current sensing in industrial devices. More particularly, the invention relates to a current sensor having a coil mounted to a current carrying bus and related system.

Current sensing is typically performed in industrial devices such as power generator exciters using conduction sensors or current transformers. The conduction sensors may take the form of large metal loops with a small gap into which a sensor is placed. Both approaches, however, require the current carrying bus runs through the sensor, and require large voltage-isolated brackets to hold the sensors. These approaches limit the size of the bus which potentially causes thermal issues. In addition, these approaches make retrofits difficult because the buswork has to be disassembled in order to insert the buswork into the new current sensors.

SUMMARY OF THE INVENTION

A first aspect of the disclosure provides a current sensor comprising: a coil for sensing current in a current carrying bus; and a mount for mounting the coil to the current carrying bus at a distance from the bus.

A second aspect of the disclosure provides a system comprising: a device including a current carrying bus; and a current sensor including: a coil for sensing current in the current carrying bus, and a mount for mounting the coil to the bus.

DETAILED DESCRIPTION OF THE INVENTION

Figure 1:
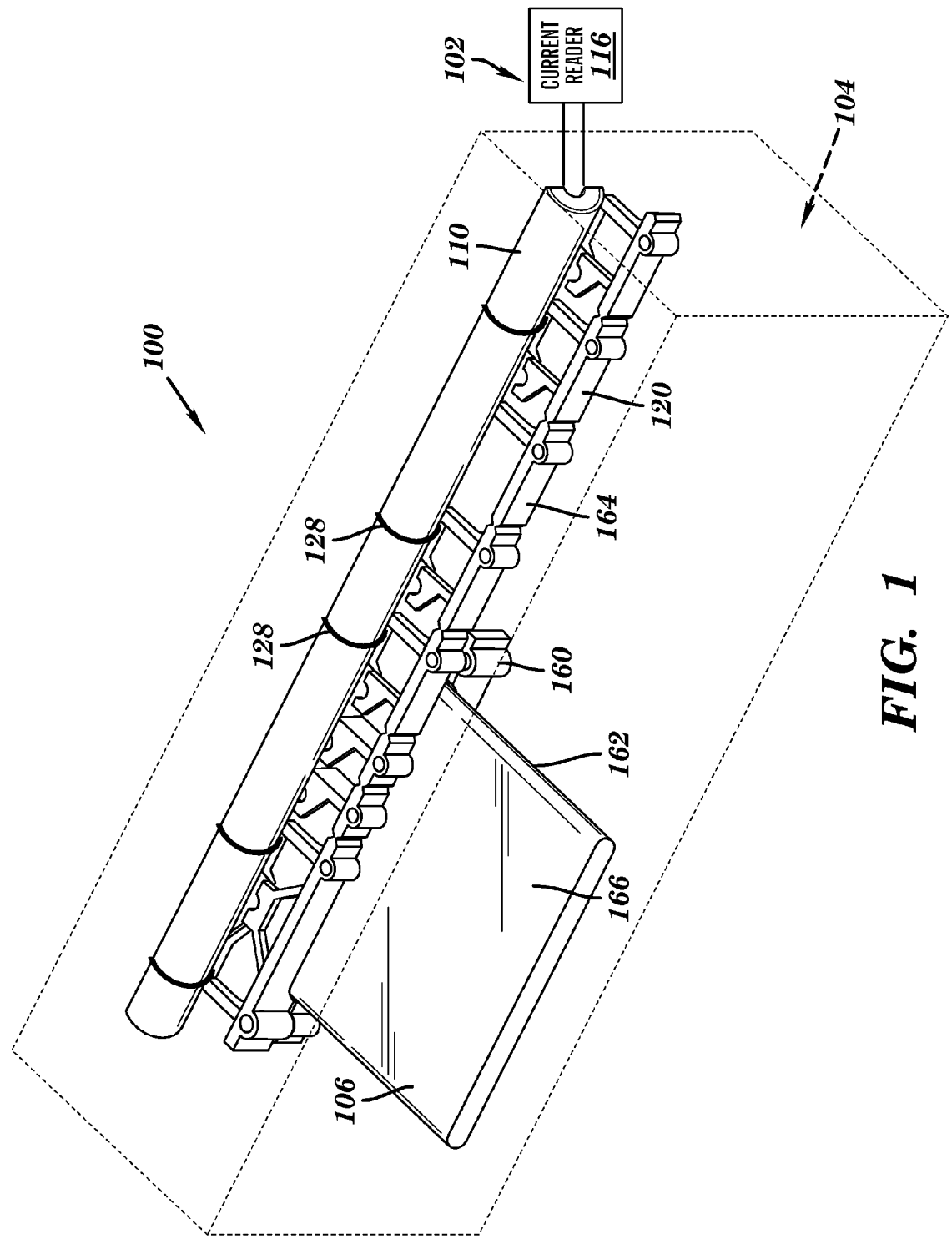
FIG. 1 shows a perspective view of a system including a current sensor according to embodiments of the invention.

Referring to the drawings, FIG. 1 shows embodiments of a system 100 illustrating an application of a current sensor 102 according to the disclosure. System 100 may include a device (not shown) including a current carrying bus 106 (hereinafter "bus"). The device may include practically any industrial device that uses a current. For example, the device may include: a power generator exciter system, a wind converter, a motor controller, etc. Bus 106 may be any electrical conductor for carrying a current between parts of a higher level system, and may take any of a variety of shapes and sizes. For example, in terms of size, a width of a bus 106 may range from approximately 2.54 cm (1 inch) to approximately 20.32 cm (8 inches), and a depth may range from about 0.635 cm (0.25 inches) to about 1.27 cm (0.50 inches). Other sizes are also possible.

Figure 2:
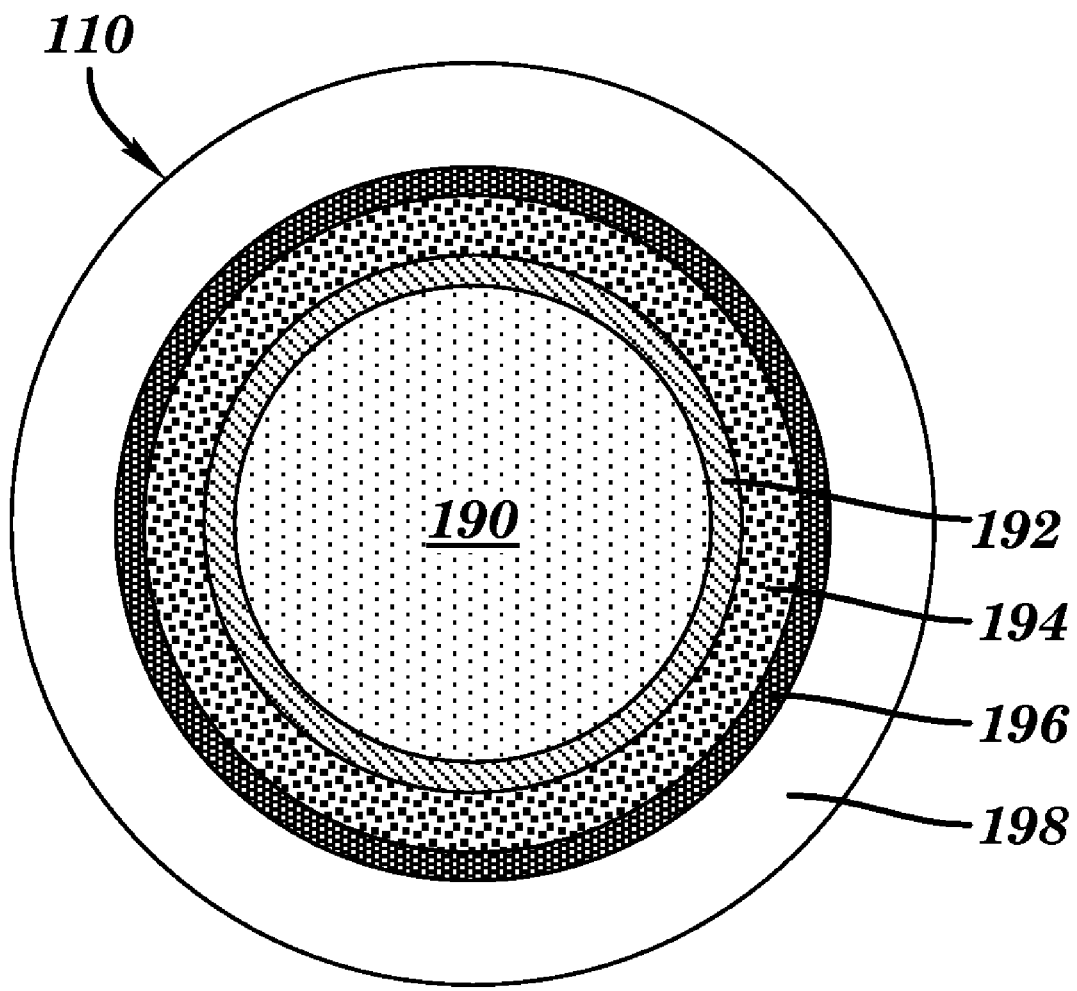
FIG. 2 shows a cross-sectional view of an illustrative coil.

Current sensor 102 may include a coil 110 for sensing current in bus 106. In one embodiment, coil 110 may include an arrangement commonly referred to as a Rogowski coil, an illustrative arrangement of which is shown in FIG. 2. As shown in FIG. 2, coil 110 may include an innermost insulative cylinder 190 (e.g., a flexible mandrel). A helical coil of wire 192, e.g., copper wire, may be positioned about innermost insulating cylinder 190 with one end of the wire returning through the center of the coil to the other end. Hence, both wire ends are located at the same end of the coil. An inner insulative layer 194 may surround coil of wire 192 and separates it from a conductive shield 196, which acts to reduce electromagnetic interference. Conductive shield 196 may be surrounded by an outer insulative layer 198 to prevent bus 106 from contacting shield 196 or coil of wire 192. The insulative layers 190, 194, 198 are usually made of a non-conductive polymer. Other coil arrangements may also be possible. As shown in FIG. 1, coil 110 may be coupled to an external current reader 116 for outputting a value of the current, which may include any device now known or later developed for determining a current value from the signal from coil 110. More specifically, any current reader capable of determining the current based on the electromagnetic field sensed by coil 110 may be applied.

Bus 106 may carry power in some applications in the range of, for example, about 1400 Volts alternating current (AC). In this setting, insulation layer 198 on coil 110 may be exposed to ionized air 104 induced by high voltage gradients between bus 106 and the coil, which degrades the insulation and may eventually lead to failure and shorting to the bus, possibly causing an explosion. This air-ionizing phenomenon may be referred to as "partial discharge". In order to address this situation, current sensor 102 also includes a mount 120 for mounting coil 110 to bus 106 at a distance from the bus. Hence, coil 110 does not directly contact bus 106 and is positioned sufficiently far away from bus 106 to prevent damage from ionization. In addition, coil 110 does not surround bus 106 as conventional current sensors typically are situated, but is external to it. The distance between bus 106 and coil 110 may vary depending on the application. For the 1400 V AC example application noted above, the distance may be about 1.27 cm (0.5 inches). In other applications, mount 120 is sized to ensure that there will be enough air gap between coil 110 and bus 106 (or mounting fasteners) to prevent partial discharge from happening even in the presence of voltages as high as, for example, 3000 V. Coil 110 may be coupled to mount 120 in a number of ways. In one example, as shown in FIG. 1, a length of material 128, e.g., a plastic strap or metal wire, may wrap around coil 110 and connect to mount 120. Other coupling mechanisms such as an adhesive, a clamp or other mechanical couplings are also possible.

Figure 3:
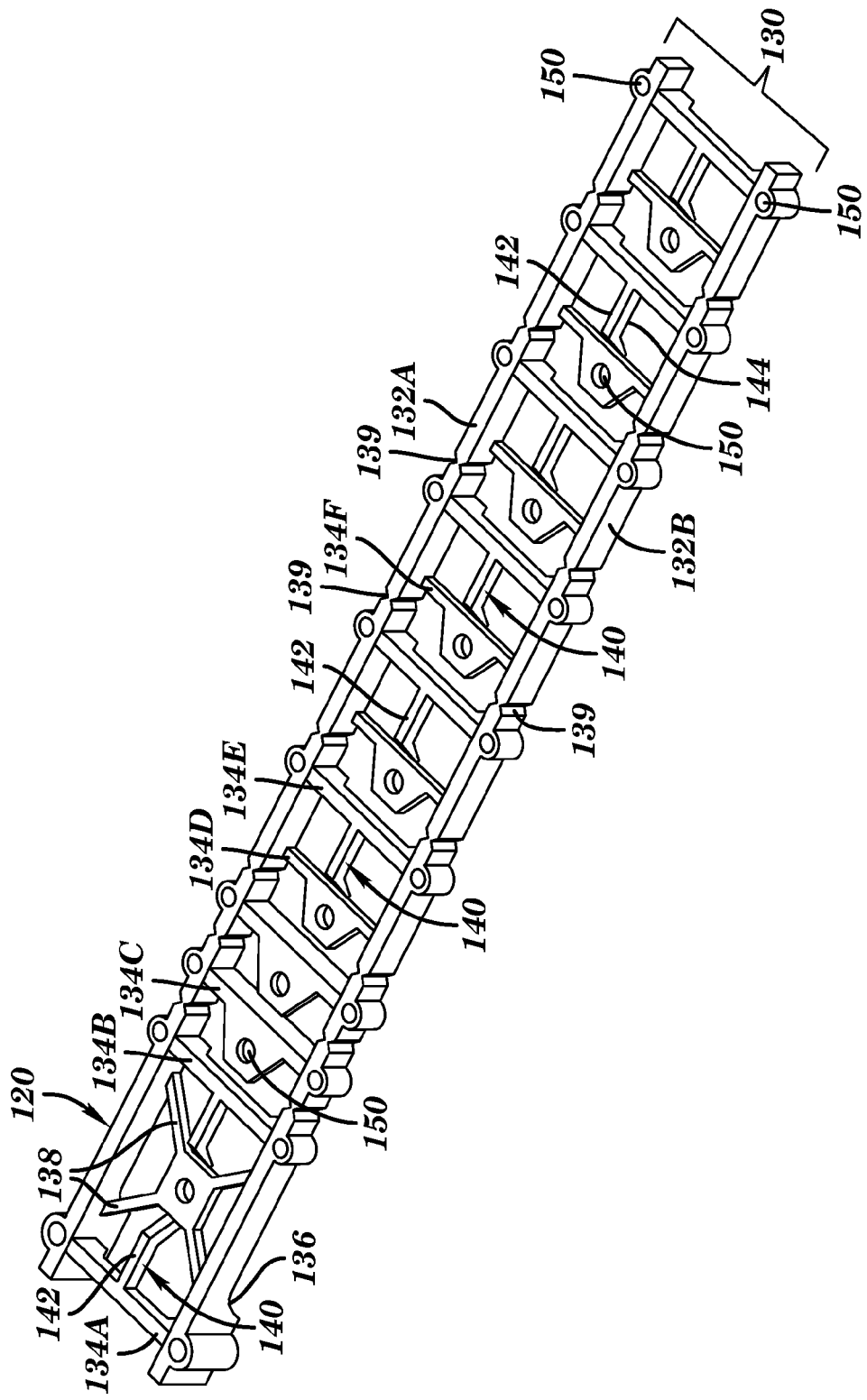
FIG. 3 shows a perspective view of a mount according to embodiments of the invention.

Mount 120 may be structured to provide proper and secure positioning for coil 110, and for flexibility in use across a variety of applications. FIGS. 2-5 show various embodiments of mount 120. Referring to FIGS. 2-3, in one embodiment, mount 120 may include a ladder structure 130 including a pair of longitudinal members 132A, 132B and interconnecting lateral arms 134A-F (not all labeled). Mount 120 may also include a referencing feature 136 for positioning the mount relative to bus 106. In the example shown, referencing feature 136 includes an undercut in longitudinal members 132A, 132B to engage an edge of bus 106. That is, longitudinal members 132A, 132B have different thicknesses along their lengths so as to form referencing feature 136. Other forms of referencing features are also possible. In addition, although only one referencing feature 136 is shown, these features may be provided anywhere along members 132A, 132B required for proper alignment and mounting to bus 106. Mount 120 may also include a diagonally extending strut 138 between pair of longitudinal members 132A, 132B to provide rigidity and/or to allow for positioning of other structure.

Figure 4:
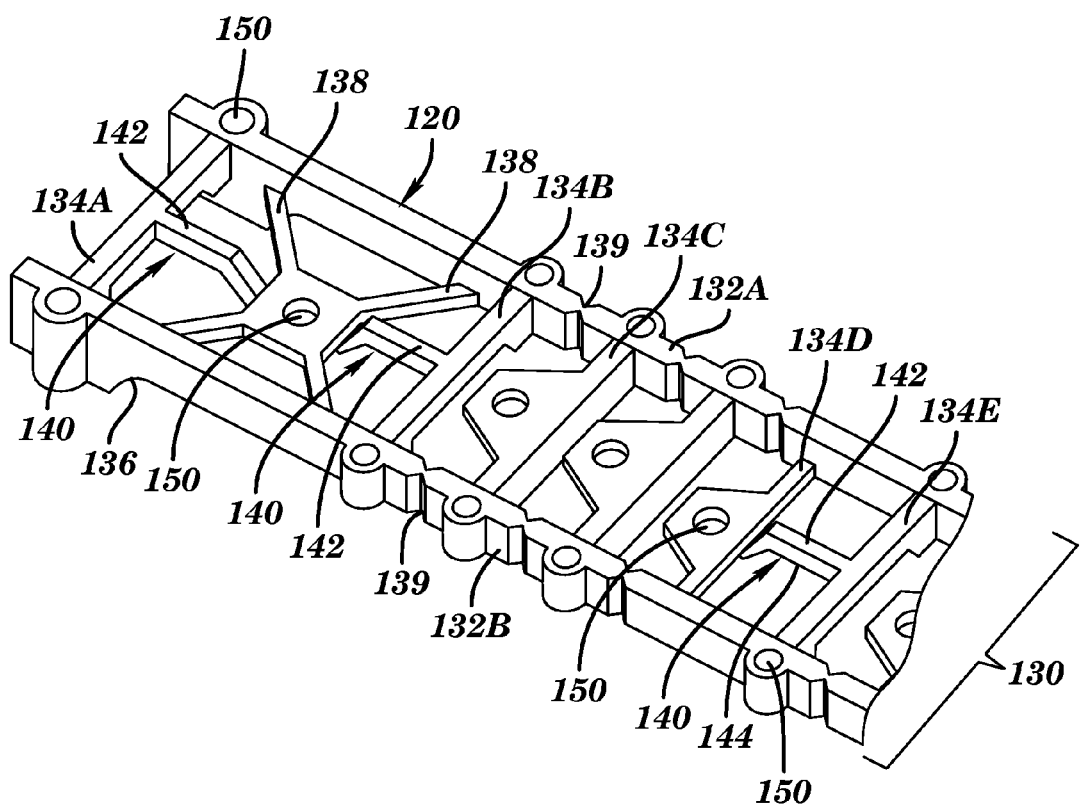
FIG. 4 shows an enlarged, partial perspective view of the mount of FIG. 3.

As shown best in FIG. 4, mount 120 may also include a plurality of coil fastening areas 140 at which coil 110 is coupled to the mount by some sort of fastener. In one example, coil fastening areas 140 include a longitudinally extending member 142 coupling adjacent lateral arms, e.g., 134A, 134B or 134D, 134E. Each longitudinally extending member 142 may include an undercut area 144 (labeled once on far right of FIGS. 2 and 3) having a thickness less than a thickness of longitudinal members 132A, 132B to accommodate a fastener such as length of material 128 (FIG. 1) in the form of, for example, a plastic strap or metal wire.

Figure 5:
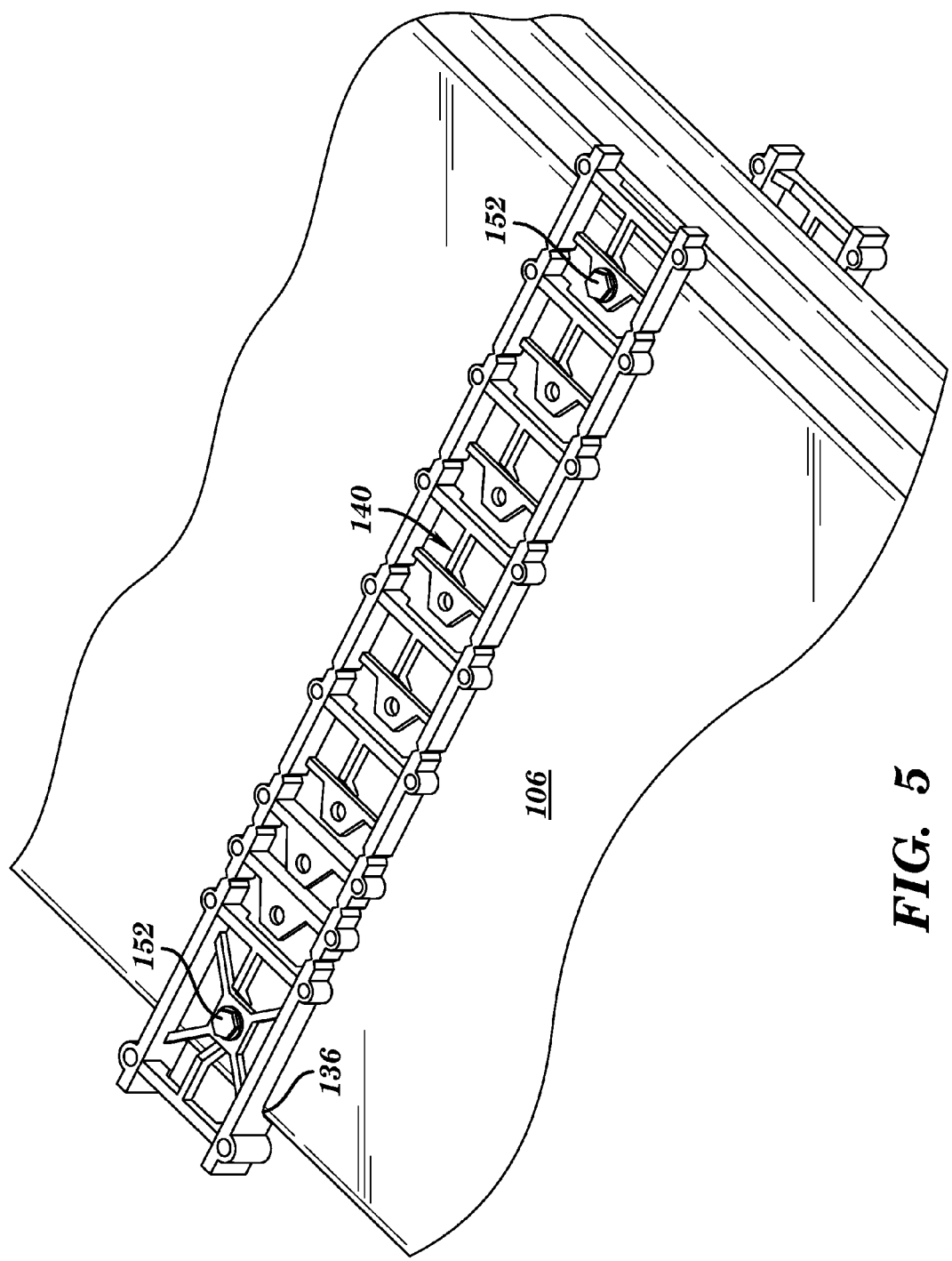
FIG. 5 shows a perspective view of a mount coupled to a current carrying bus according to embodiments of the invention.

As shown in FIG. 5, in one embodiment, mount 120 may be coupled directly to bus 106 using any number of mounting holes 150 (FIGS. 2-3) and fasteners 152 required. Mounting holes 150 may be provided in any number of locations such as in longitudinal members 132A, 132B, within diagonal struts 138, within lateral arms 134A-F, etc. Fasteners 152 may include any connector, for example, metal or plastic screws or bolts, adequate to fixedly couple mount 120 to bus 106 and withstand the environment of the device. In an alternative embodiment, shown in FIGS. 1 and 5, mount 120 includes a first portion 160 positioned on a first side 162 of bus 106 and a second portion 164 positioned on a second side 166 of bus 106. First and second portions 160, 164 are coupled together by fasteners 152 (FIG. 6 only), and coil 110 is coupled to one of the first and second portions. Mount 120, hence, clamps onto bus 106, removing the need for mounting holes in bus 106. Portions 160, 162 may be identical or one may include structures, e.g., mounting hole extenders 168 (FIG. 6), that the other portion does not include to accommodate mounting to bus 106. In the former case, each identical portion 160, 162 may include complementary referencing features 136 providing adequate space for bus 106 therein.

Figure 6:
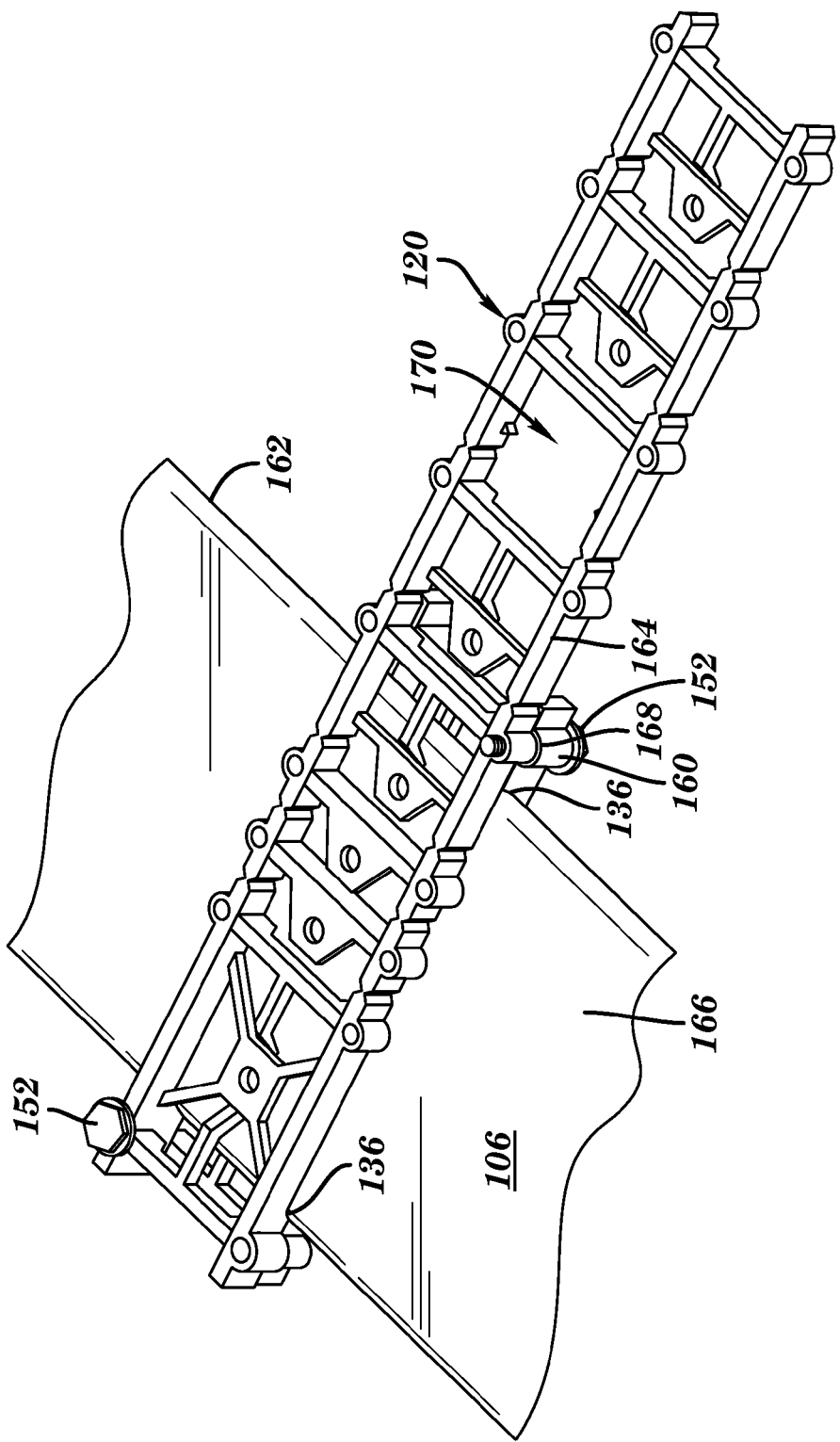
FIG. 6 shows a perspective view of a mount coupled to a current sensor according to another embodiment of the invention.

Mount 120 may be formed to fit a particular bus 106 or may be formed to fit a variety of different sized and/or shaped buses 106. In terms of the latter situation, as shown in FIGS. 2-3, mount 120 may include separation points 139 at which ladder structure 130 can be separated into portions, e.g., by cutting. In one embodiment, separation points 139 include opposing narrowed locations in longitudinal members 132A, 132B; however, other structure may be possible to weaken members 132A, 132B to be easily separated. Alternatively, if the material of mount 120 is easily separated without any weakening structure, separation points 139 may be devoid of any such structure. In any event, mount 120 may be used in its entirety or portions thereof removed using separation points 139. That is, mount 120 may be shortened to a particular, desired length so as to accommodate a particularly shaped and/or sized bus 106. Hence, while mount 120 may be initially formed to accommodate an 20.32 cm (8 inch) wide bus, it may be cut to length to make it fit, for example, a 17.78, 15.24, 12.7, 10.16, 7.62, 5.08, 3.81 or 2.54 cm (7", 6", 5", 4", 3", 2", 1.5" or 1", respectively) wide bus. The removed portions of mount 120 may be discarded, recycled or re-used elsewhere. As shown in FIG. 5, mount 120 may be positioned exclusively over bus 106, or, as shown in FIGS. 1 and 5, may be cantilevered out beyond an edge of bus 106. As shown in FIG. 6, portions 170 of mount 120 may be removed to allow for feed through of wiring of coil 110, if required. Coil 110 need not have the same length as mount 120.

Mount 120 may be constructed of any insulative material capable of withstanding temperatures anticipated for the particular device in which it is used. For example, for a power generator exciter system, temperatures may exceed 80° C. Hence, mount 120 may need to be able to withstand that temperature. Where separation points 139 are employed, mount 120 must be constructed of material that is also soft enough to allow for separation (e.g., by cutting or pulling) at the separation points. Illustrative materials may include but are not limited to: synthetic polyimide fiber (e.g., Nylon), polyphenylene sulfide, polyetherimide (e.g., Extem, a trademark of SABIC), polyimide thermoplastic resins (e.g., Ultem, a trademark of SABIC), etc. For manufacturing purposes, mount 120 may be made of an injection moldable material.

Although particular embodiments of mount 120 have been described herein, it is understood that a large variety of different shaped and sized structures may be employed to provide the same or similar function, and all are considered within the scope of the teachings of the invention.

The above-described current sensor 102 simplifies installation in the factory and the field, especially on retrofits because the need to disassemble buswork is eliminated. No buswork has to be disassembled, and bus size restrictions are largely eliminated. The ability to mount directly to a bus 106 or clamp around it further expands the variety of buses 106 to which current sensor 102 can be applied.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The modifier "about" used in connection with a quantity is inclusive of the stated value and has the meaning dictated by the context, (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to about 25 wt %, or, more specifically, about 5 wt % to about 20 wt %", is inclusive of the endpoints and all intermediate values of the ranges of "about 5 wt % to about 25 wt %," etc).

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A current sensor comprising:
    a coil for sensing current in a current carrying bus; and
    a mount for mounting the coil to the current carrying bus at a distance from the bus, the mount including a ladder structure having:
        a pair of longitudinal members;
        interconnecting lateral arms each connected to the pair of longitudinal members; and
        coil fastening areas connected to at least one of the interconnecting lateral arms, wherein the coil is coupled to at least one of the coil fastening areas between the pair of longitudinal members.

2. The current sensor of claim 1, wherein the coil includes an outer insulative layer and the mount includes an insulative material.

3. The current sensor of claim 1, wherein the mount includes separation points along each of the pair of longitudinal members at which the ladder structure can be separated into portions.

4. The current sensor of claim 1, wherein the plurality of coil fastening areas include a longitudinally extending member coupling adjacent lateral arms.

5. The current sensor of claim 4, wherein each longitudinally extending member includes an undercut area having a thickness less than a thickness of the longitudinal members.

6. The current sensor of claim 1, further comprising a diagonally extending strut between the pair of longitudinal members.

7. The current sensor of claim 6, further comprising a mounting hole for receiving a fastener coupled to the diagonally extending strut.

8. The current sensor of claim 1, wherein the mount includes a mounting hole for receiving a fastener.

9. The current sensor of claim 1, wherein the mount includes a referencing feature for positioning the mount relative to the current carrying bus.

10. The current sensor of claim 1, wherein the mount includes a first portion positioned on a first side of the current carrying bus and a second portion positioned on a second side of the bus and coupled to the first portion, the coil coupled to one of the first and second portions.

11. The current sensor of claim 1, further comprising a current reader for outputting a value of the current.

12. The current sensor of claim 1, wherein the coil includes a Rogowski coil.

13. A system comprising:
a device including a current carrying bus; and
a current sensor including:
 a coil for sensing current in the current carrying bus; and
 a mount for mounting the coil to the bus, the mount including a ladder structure having:
 a pair of longitudinal members;
 interconnecting lateral arms each connected to the pair of longitudinal members; and
 coil fastening areas connected to at least one of the interconnecting lateral arms, wherein the coil is coupled to at least one of the coil fastening areas between the pair of longitudinal members.

14. The system of claim 13, wherein the device is selected from the group consisting of: a power generator exciter system, a wind converter and a motor controller.

15. The system of claim 13, wherein the mount includes separation points along each of the pair of longitudinal members at which the ladder structure can be separated into portions.

16. The system of claim 13, wherein the mount includes a plurality of coil fastening areas include a longitudinally extending member coupling adjacent lateral arms.

17. The system of claim 13, wherein the mount includes a first portion positioned on a first side of the current carrying bus and a second portion positioned on a second side of the bus and coupled to the first portion, the coil coupled to one of the first and second portions.

* * * * *